United States Patent [19]

Ohmori et al.

[11] Patent Number: 4,868,996

[45] Date of Patent: Sep. 26, 1989

[54] METHOD AND APPARATUS FOR VAPOR DRYING

[75] Inventors: Toshiaki Ohmori; Masaharu Hama; Takaaki Fukumoto, all of Itami, Japan

[73] Assignee: Mitsubishi Denki Kabushiki Kaisha, Japan

[21] Appl. No.: 172,310

[22] Filed: Mar. 23, 1988

[30] Foreign Application Priority Data

Dec. 29, 1987 [JP] Japan ................................. 62-333643

[51] Int. Cl.[4] .............................................. F26B 7/00
[52] U.S. Cl. .......................................... 34/13; 34/20; 34/78

[58] Field of Search ................... 34/66, 65, 62, 60, 73, 34/75, 78, 74, 13, 20

[56] References Cited

U.S. PATENT DOCUMENTS 4,558,524 12/1985 Peck et al. ............................. 34/78

FOREIGN PATENT DOCUMENTS 59-189276 10/1984 Japan .

Primary Examiner—Henry A. Bennet
Attorney, Agent, or Firm—Leydig, Voit & Mayer

[57] ABSTRACT

An object to be dried is cooled and then held within an atmosphere of a drying medium vapor, until the temperature of the surface of the object rises to the temperature of the vapor.

9 Claims, 2 Drawing Sheets

METHOD AND APPARATUS FOR VAPOR DRYING

BACKGROUND OF THE INVENTION

1. Field of the Invention

The present invention relates to a method of and apparatus for vapor drying an object. More particularly, the present invention is concerned with a method and apparatus for drying objects such as semiconductor wafers and other semiconductor devices with the vapor of a drying medium such as alcohol or freon, i.e., a fluorocarbon.

2. Description of the Related Art

Referring to FIG. 3, a typical known apparatus for vapor drying an object has a substantially cylindrical vessel 1 which is closed at its bottom and open at its top. The vessel 1 holds a suitable amount of isopropyl alcohol 2. A heater 3 for heating the isopropyl alcohol 2 is placed under the bottom of the vessel 1. A waste liquid pan 4 is provided in the vessel 1. A cooling pipe 5 in the form of a coil is placed in the vessel 1 along the inner peripheral surface of the vessel 1 at an upper portion thereof. A refrigerant circulating means (not shown) is connected to the cooling pipe 5 to circulate a refrigerant through the cooling pipe 5.

In operation, the isopropyl alcohol 2 in the vessel 1 is boiled and evaporated by the heat from the heater 3. Meanwhile, a cold atmosphere is formed in the upper portion of the vessel 1 as a result of the recirculation of the refrigerant through the cooling pipe 5 by the refrigerant circulating means. In consequence, the vapor of the isopropyl alcohol rises to the upper portion of the vessel 1 where it is then cooled and condensed into a liquid phase and falls back into the liquid portion of the isopropyl alcohol at the bottom of the vessel 1. The isopropyl alcohol vapor is therefore prevented from escaping from the vessel 1 and fills up the vacant spaces in the vessel 1. In this state, the isopropyl alcohol vapor is held at a temperature substantially equal to the boiling temperature of isopropyl alcohol which is about 83° C.

An object to be dried is set in the vessel 1. The object is, for example, a semiconductor wafer 6 that has been washed with water and still has moisture remaining on its surface. The portion of the alcohol vapor that contacts the surface of the semiconductor wafer 6 is cooled and liquefies to mix with the moisture on the surface of the semiconductor wafer 6. These droplets progressively increase in size due to the continuous condensation of the isopropyl alcohol and flow down along the surface of the semiconductor wafer 6. The droplets then drip into the waste liquid pan 4 and are discharged to the outside of the vessel 1 through a drain pipe 7.

Thus, the moisture on the surface of the semiconductor wafer 6 is replaced by the isopropyl alcohol.

Referring now to FIG. 4, the temperature $T_1$ of the surface of the wafer 6 progressively increases after the moment $t_0$ at which the wafer 6 is set in the vassel 1. On the other hand, the temperature $T_2$ of the isopropyl alcohol 2 in the vassel 1 temporarily decreases due to the wafer 6 and then rises again to near the boiling point of 83° C. When the temperature $T_1$ of the surface of the wafer 6 has reached almost the temperature $T_2$ of the isopropyl alcohol, which is about 83° C., the liquid phase of the isopropyl alcohol, which has replaced the remaining moisture on the surface of the wafer 6, evaporates, whereby the drying of the wafer 6 is completed.

This known drying method has the following problem.

In this method, the drying of the object relies upon the replacement of the moisture remaining on the object with the drying medium, i.e., isopropyl alcohol, which liquefies upon contact with the relatively cool surface of the object. This replacement is effectively achieved only when the temperature of the surface of the object is below the temperature of the alcohol vapor. Thus, the time available for the replacement is limited and there is a risk that the water content on the object surface cannot be fully replaced by the alcohol with the result that the object is dried imperfectly.

This problem is serious particularly when the object to be dried has high thermal conductivity. In such a case the temperature of the surface of the object rapidly rises to that of the vapor temperature. Thus, the described known drying method does not always satisfactorily dry the object particularly when the object has high thermal conductivity.

SUMMARY OF THE INVENTION

Accordingly, an object of the present invention is to provide a method and apparatus for vapor drying an object, capable of satisfactorily drying the object regardless of the composition of the object, thereby overcoming the above-described problems of the prior art.

To this end, according to one aspect of the present invention, there is provided a method of vapor drying an object comprising cooling the object to be dried; and holding the cooled object within the atmosphere of the vapor of the drying medium until the temperature of the surface of the object rises to the temperature of the vapor.

According to another aspect of the invention, there is provided an apparatus for vapor drying an object, comprising: cooling means for cooling the object; a vapor tank containing a drying medium; heating means for heating the drying medium in the vapor tank to evaporate the drying medium thereby filling vacant spaces in the vapor tank with the vapor of the drying medium; and holding means for holding the object and for moving the object between a cooling position near the cooling means and a drying position in the vapor tank.

According to the invention, the object to be dried is placed in the atmosphere of the vapor of the drying medium after it is forcibly cooled, so that the time required for the object surface temperature to reach the vapor temperature is long enough to allow the replacement of the wetting component on the object with the drying medium to a satisfactory level, whereby the object is sufficiently dried.

The above and other objects, features and advantages of the invention will become clear from the following description of the preferred embodiment when the same is read in conjunction with the accompanying drawings.

DESCRIPTION OF THE PREFERRED EMBODIMENT

The invention will be more clearly understood from the following description of a preferred embodiment.

Figure 1:
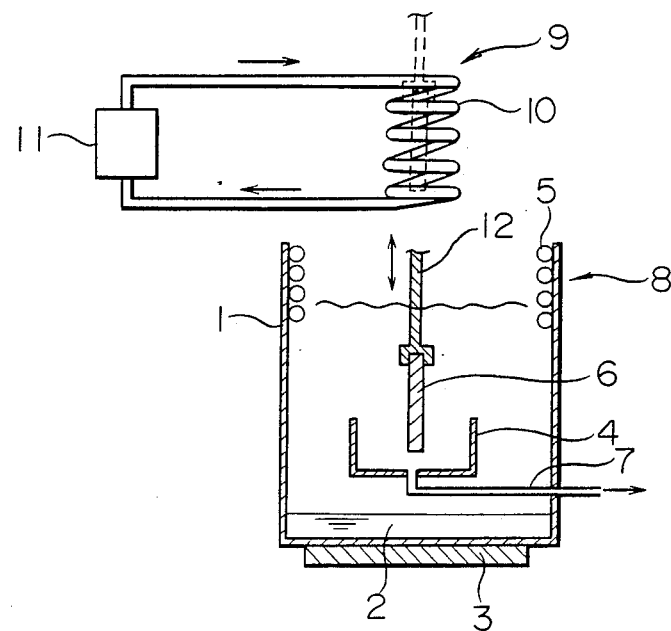
FIG. 1 is a sectional view of an apparatus for vapor drying an object in accordance with an embodiment of the present invention.

Referring to FIG. 1, the apparatus of the present invention has a substantially cylindrical vessel 1 which is closed at its bottom and open at its top. A waste liquid pan 4 is disposed in the vessel 1. A cooling pipe 5 in the form of a coil is disposed along the inner peripheral surface of the vessel 1 at an upper portion thereof. A refrigerant circulating means (not shown) is connected to the cooling pipe 5 so that a refrigerant as a cooling medium is recirculated through the cooling pipe 5. The vessel 1, waste liquid receiver 4 and the cooling pipe 5 in combination constitute a vapor tank 8. A heater 3 as a heating means is disposed under the bottom of the vapor tank 8.

Figure 2:
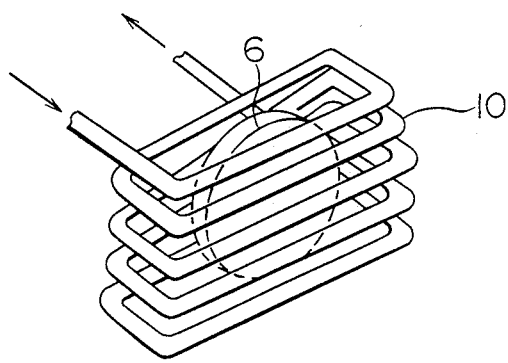
FIG. 2 is a perspective view of a cooling section in the apparatus shown in FIG. 1.
Figure 3:
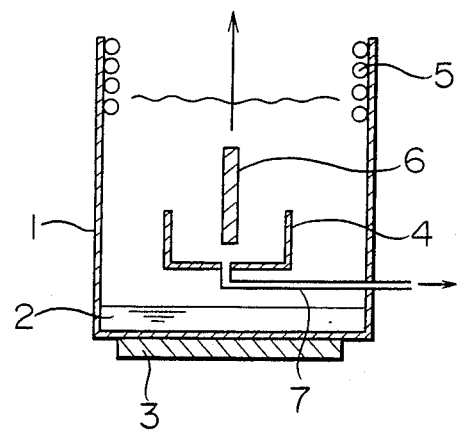
FIG. 3 is a sectional view of a known drying apparatus for vapor drying an object.
Figure 4:
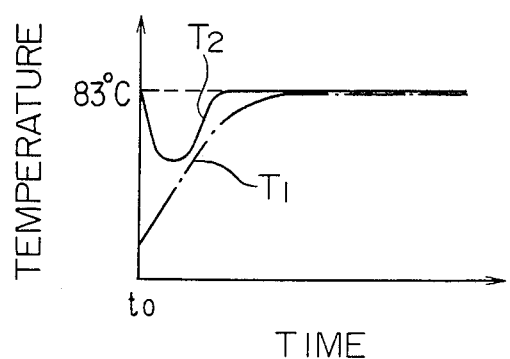
FIG. 4 is a graph showing changes in the temperature of the surface of an object to be cooled and the temperature of the vapor of isopropyl alcohol as the drying medium in the known apparatus shown in FIG. 3.

The apparatus of the invention further has a cooling means 9 which is disposed above the vapor tank 8 for cooling an object to be dried. More specifically, the cooling means 9 includes a cooling section 10 including a cooling pipe in the form of a coil as shown in FIG. 2 disposed directly above the vapor tank 8, and a refrigerant supply section 11 connected to the cooling pipe of the cooling section 10 for supplying a refrigerant as a cooling medium to the cooling pipe of the cooling section 10.

The apparatus of this embodiment further has an object holding means including a holding member 12 which is capable of holding the object to be dried and moving vertically between a drying position in the vapor tank 8 and a cooling position in the cooling section 10 of the cooling means 9.

The vessel 1 of the vapor tank 8 is filled with a drying medium up to a level suitable for the drying operation. In this embodiment, isopropyl alcohol 2 is used as the drying medium.

In operation, the isopropyl alcohol 2 in the vapor tank 8 is heated by the heat from the heater 3 up to about 83° C. so that the isopropyl alcohol boils and is evaporated. Meanwhile, the refrigerant is circulated through the cooling pipe 5 by the refrigerant circulating means, so that the atmosphere in the upper portion of the vessel 1 is cooled.

In consequence, the vapor of the isopropyl alcohol 2 evaporated by the heat from the heater 3 rises to the upper portion of the vessel 1 from the bottom thereof. The vapor is cooled and condensed into its liquid phase by the cooling pipe 5 and falls back into the liquid portion of the isopropyl alcohol 2 on the bottom of the vessel 1. Consequently, the vapor is prevented from being scattered to the exterior of the vapor tank 8 and the vacant space in the vapor tank 8 is filled with the vapor of the isopropyl alcohol which is maintained at about 83° C.

While the vapor tank 8 is filled with alcohol vapor, an object to be dried, which is for example a semiconductor wafer 6 immediately after washing and still wet with moisture, is held by the holding member 12. The holding member 12 is operated to place the wafer 6 in the cooling section 10 of the cooling means 9. The coiled cooling pipe of the cooling section 10 is supplied with a refrigerant at a low temperature by the refrigerant supply section 11, so that the wafer 6 held by the holding member 12 is cooled. The cooling effect produced by the cooling means 9 is suitably controlled such that the temperature of the surface of the wafer 6 does not fall bellow 0° C., in order to prevent the moisture on the wafer 6 from being frozen.

Then, the holding member 12 is lowered at a speed of, for example, 5 to 50 cm/sec, so that the wafer 6 cooled by the cooling means 9 is brought into the atmosphere of isopropyl alcohol vapor in the vapor tank 8. In consequence, a portion of the vapor is cooled and liquefied by the cold wafer 6 upon contact with the latter, so that the moisture droplets remaining on the surface of the wafer 6 are mixed with the liquefied alcohol. The size of the droplets on the surface of the wafer 6 progressively increases as a result of continuous condensation of the alcohol vapor on the wafer surface. The droplets therefore start to flow down along the surface of the wafer 6 and fall into the waste liquid pan 4, and are discharged to the outside of the vessel 1 through the discharge pipe 7.

Consequently, the moisture droplets on the surface of the wafer 6 are progressively substituted by the liquefied isopropyl alcohol. The surface temperature of the wafer 6 gradually rises and reaches the temperature of the alcohol vapor filling the vapor tank 8, a process that takes, example, for several minutes. The wafer 6 is held in the vapor tank 8 by the holding member 12, until the surface temperature of the wafer 6 reaches the temperature of the alcohol vapor. Thereby, the liquid phase of isopropyl alcohol attached to the surface of the wafer 6 in place of the remaining moisture droplets is completely evaporated by the time the temperature of the surface of the wafer 6 reaches the vapor temperature of about 83° C.

Subsequently, the holding member 12 is raised at a speed of 5 to 50 cm/sec to raise the semiconductor wafer 6 from the vapor tank 8, whereby one drying operation cycle is completed.

If the object could not be dried satisfactorily by a single cooling operation cycle, the holding member 12 is operated to reciprocate between the cooling position in the cooling means 9 and the drying position in the vapor tank 8, to repeatedly conduct the drying cycle described above, until the object is dried to the desired degree.

The speed at which the object to be dried is brought into and out of the vapor tank 8 is preferably high, even though a speed of 5 to 50 cm/sec was disclosed in the embodiment.

It is also to be understood that, while the described embodiment employs isopropyl alcohol as the drying medium, the invention does not exclude the use of other types of drying mediums such as other alcohols. It is also possible to use a freon, i.e., fluorocarbon, solvent as the drying medium to dry any alcohol component on the object. In such a case, the moisture droplets on the object may first be replaced with alcohol which in turn may be replaced with a solvent from the freon group.

The refrigerant circulated through the cooling pipe of the cooling section 10 of the cooling means 9 and the refrigerant circulated through the cooling pipe 5 of the vapor tank 8 may be a liquid or gas, provided that it can produce a sufficient cooling effect.

It is possible to make use of a refrigeration cycle such that the cooling section 10 of the cooling means 9 and the cooling pipe 5 in the vapor tank comprise respective portions of the evaporator of refrigerators.

As will be understood from the foregoing description, the present invention offers the following advantage.

Since, since the object to be dried is forcibly cooled before it is put into contact with the drying vapor, the length of time until the temperature of the object surface rises to the temperature of the drying vapor is increased, thus ensuring sufficient replacement of the wetting component on the object with the drying medium. It is therefore possible to satisfactorily dry the object even when the object is made of a material having a high thermal conductivity.

What is claimed is:

1. A method of vapor drying an object comprising:
   cooling an object to be dried;
   holding the cooled object within a vapor of a drying medium until the temperature of the surface of said object rises to the temperature of said vapor whereby vapor of said drying medium condenses on and drips from the surface of said object, carrying away another liquid that was present on said object.

2. A method according to claim 1 wherein said cooling and holding steps are executed cyclically and repeatedly.

3. A method according to claim 1 wherein said drying medium is an alcohol.

4. A method according to claim 3 wherein said drying medium is isopropyl alcohol.

5. A method according to claim 1 wherein said drying medium is a fluorocarbon.

6. An apparatus for vapor drying an object comprising:
   cooling means for cooling an object;
   a vapor tank disposed remotely from said cooling means for containing a liquid drying medium;
   heating means for heating and evaporating said liquid drying medium in said vapor tank to fill said vapor tank with the vapor of said drying medium;
   holding means for holding said object and for moving said object between a cooling position near said cooling means and remote from said vapor tank and a drying position within said vapor tank; and
   waste collection means disposed in said vapor tank for collecting liquid drying medium that condenses on and drips from said object in said drying position and for discharging the collected liquid from said vapor tank.

7. An apparatus according to claim 6 wherein said cooling means includes a cooling section having a coiled cooling pipe, and a refrigerant supplying section for supplying a refrigerant to said cooling pipe.

8. A apparatus according to claim 6 wherein said vapor tank includes a substantially cylindrical vessel with a closed bottom and an open top and a vapor cooling portion disposed proximate said top.

9. A method according to claim 1 including cooling said object to a temperature between the freezing point of water and the boiling point of said drying medium.

* * * * *